(12) United States Patent
Yu et al.

(10) Patent No.: US 12,477,857 B2
(45) Date of Patent: Nov. 18, 2025

(54) OPTICAL SENSOR DEVICE AND PACKAGING METHOD THEREOF

(71) Applicant: OIP Technology Pte Ltd, Singapore (SG)

(72) Inventors: Deze Yu, Singapore (SG); Wanning Zhang, Singapore (SG)

(73) Assignee: OIP TECHNOLOGY PTE LTD., Singapore (SG)

( * ) Notice: Subject to any disclaimer, the term of this patent is extended or adjusted under 35 U.S.C. 154(b) by 494 days.

(21) Appl. No.: 17/974,251

(22) Filed: Oct. 26, 2022

(65) Prior Publication Data

US 2024/0113248 A1  Apr. 4, 2024

(30) Foreign Application Priority Data

Sep. 30, 2022  (CN) .......................... 202211217998.1

(51) Int. Cl.
| | |
|---|---|
| *H10F 55/255* | (2025.01) |
| *G01S 7/481* | (2006.01) |
| *H10F 71/00* | (2025.01) |
| *H10F 77/00* | (2025.01) |
| *H10F 77/30* | (2025.01) |
| *H10F 77/50* | (2025.01) |

(52) U.S. Cl.
CPC .......... *H10F 55/255* (2025.01); *G01S 7/4814* (2013.01); *G01S 7/4816* (2013.01); *H10F 71/139* (2025.01); *H10F 77/331* (2025.01); *H10F 77/50* (2025.01); *H10F 77/933* (2025.01); *H10F 77/953* (2025.01)

(58) Field of Classification Search
CPC .................. H10F 77/50; H10F 55/25
See application file for complete search history.

(56) References Cited

U.S. PATENT DOCUMENTS

| | | | |
|---|---|---|---|
| 2012/0104454 A1* | 5/2012 | Coffy ................ | G02B 13/0085 257/E33.059 |
| 2021/0399157 A1* | 12/2021 | Luan ....................... | H10F 77/50 |

\* cited by examiner

*Primary Examiner* — Matthew L Reames
(74) *Attorney, Agent, or Firm* — MUNCY, GEISSLER, OLDS & LOWE, P.C.

(57) ABSTRACT

An optical sensor device and a packaging method thereof are disclosed. The optical filter structure includes a light-emitting module, a first structure, a second structure and a mask layer. The first and second structures are formed on opposing ends of light-emitting module and cover portions of light-emitting module. The light-emitting module includes a light exit region, a photosensitive member and an optical filter layer. The light exit region and photosensitive member are both located on a side of light-emitting module close to first structure, the first structure exposes light exit region and photosensitive member. The optical filter layer wraps exposed portion of photosensitive member. The mask layer is arranged on first structure and surface of light-emitting module facing first structure, and the mask layer exposes light exit region and photosensitive member, avoiding influence of external light on optical sensor device through mask layer.

4 Claims, 2 Drawing Sheets

OPTICAL SENSOR DEVICE AND PACKAGING METHOD THEREOF

CROSS-REFERENCES TO RELATED APPLICATION

This application claims the priority of Chinese patent application number 202211217998.1, filed on Sep. 30, 2022, the entire contents of which are incorporated herein by reference.

TECHNICAL FIELD

The present invention relates to the field of optical sensor design and fabrication technology and, in particular, to an optical sensor device and a packaging method thereof.

BACKGROUND

Existing photoelectric sensors include a chip, which is detection of light signal and a light source, both on a PCB. The chip can be a photo diode or photo diode plus driver IC and the light source are bonded with metal wires and covered with a cover that confines the chip and the light source between the PCB and the cover. An optical filter is provided on the cover, leaving a gap between the light source and the optical filter. This structure is limited in terms of miniaturization.

SUMMARY

It is an object of the present invention to provide an optical sensor device and a packaging method for optical sensor device. The size of the optical sensor device can be reduced without reducing the optical performance, thereby saving space.

To this end, in an aspect of the present invention, there is provided an optical sensor device, including a light-emitting module, a first structure, a second structure and a mask layer, the first structure and the second structure being formed on opposing ends of the light-emitting module and covering portions of the light-emitting module, the light-emitting module comprising a light exit region, a photosensitive member and an optical filter layer, wherein the light exit region and the photosensitive member are both located on a side of the light-emitting module close to the first structure, the first structure exposes the light exit region and the photosensitive member, the optical filter layer wraps the exposed portion of the photosensitive member, the mask layer is arranged on the first structure and the surface of the light-emitting module facing the first structure, and the mask layer exposes the light exit region and the photosensitive member.

Optionally, the mask layer has a thickness of not more than 75 μm.

Optionally, the mask layer forms openings both in the light exit region and the photosensitive member, and a depth-width ratio of each opening is greater than or equal to 10:1.

Optionally, the openings are filled with a transparent polymer material, and the transparent polymer material in the openings is able to isolate the external environment from the light exit region and the light sensing member.

Optionally, the optical sensor device has an overall thickness of less than 400 μm. Optionally, the light-emitting module comprises a plastic encapsulation layer, a light-emitting unit and a driver chip, the light-emitting unit and the driver chip both embedded in the plastic encapsulation layer, the light-emitting unit and the driver chip spaced apart from each other; each of the plastic encapsulation layer, the light-emitting unit and the driver chip having a front side and a back side, the front sides of the plastic encapsulation layer, the light-emitting unit and the driver chip facing a same direction, the front and back sides of the light-emitting unit and the front side of the driver chip being exposed from the plastic encapsulation layer, wherein the front side of the light-emitting unit is provided with the light exit region and the front side of the driver chip is provided with the photosensitive member.

Optionally, the material of the plastic encapsulation layer is a resin material that is opaque to light.

Optionally, the plastic encapsulation layer is provided therein with a plurality of through holes, which extend in a thickness direction through the front and back sides of the plastic encapsulation layer, and in which a conductive material is filled, the conductive material filled in the through holes is configured to electrically connect circuits on the front side of the plastic encapsulation layer to circuits on the back side of the plastic encapsulation layer.

Optionally, the first structure comprises a first passivation layer, a first metal layer and a second passivation layer, which are formed over the front side of the plastic encapsulation layer sequentially in this order; the first passivation layer covering the front side of the plastic encapsulation layer and the front side of the driver chip in such a manner that the photosensitive member in the driver chip, the light exit region and part of the front side of the plastic encapsulation layer are exposed from the first passivation layer and that the conductive material in the through holes are exposed from the front side of the plastic encapsulation layer; the first metal layer comprising a plurality of first bonding pads, wherein the plurality of first bonding pads are located on parts of the first passivation layer and are electrically connected to the driver chip, the conductive material in the through holes and the light-emitting unit, and the second passivation layer covering the first passivation layer and the first metal layer in such a manner that the photosensitive member and the light exit region are exposed from the second passivation layer.

Optionally, the second structure comprises a third passivation layer, a second metal layer and a fourth passivation layer, which are formed over the back side of the plastic encapsulation layer sequentially in this order, the third passivation layer covering the back side of the plastic encapsulation layer and the back side of the driver chip in such a manner that the back side of the light-emitting unit is exposed from the third passivation layer and that the conductive material in the through holes is exposed from the back side of the plastic encapsulation layer, the second metal layer comprising a plurality of second bonding pads, which are located on parts of the third passivation layer and are electrically connected to the conductive material in the through holes and the light-emitting unit, the fourth passivation layer covering the third passivation layer and the second metal layer, the fourth passivation layer provided therein with at least two connecting holes in which the second metal layer is exposed, the connecting holes filled with a conductive material, the conductive material in the connecting holes configured to be electrically connected to an external circuit.

In another aspect of the present invention, there is provided a packaging method for the optical sensor device, including the steps of: forming a light-emitting module, forming a first structure and a second structure respectively on opposing ends of the light-emitting module, the first structure and the second structure covering portions of the light-emitting module, the light-emitting module comprising a light exit region, a photosensitive member and an optical filter layer, wherein the light exit region and the photosensitive member are both located on a side of the light-emitting module close to the first structure, the first structure exposes the light exit region and the photosensitive member, the optical filter layer wraps the exposed portion of the photosensitive member; and forming mask layer, the mask layer arranged on the first structure and the surface of the light-emitting module facing the first structure and exposing the light exit region and the photosensitive member of the light-emitting module.

Optionally, the mask layer is formed by means of screen printing or by exposure and development with a photosensitive material using a photomask, and openings are formed in the light-emitting area and the photosensitive member.

Optionally, after the formation of the mask layer, the packaging method further includes: filling the openings with a transparent polymer material to isolate the external environment from the light-emitting area and the light sensing member.

Optionally, forming a light-emitting module specifically includes: providing a carrier substrate, one side of the carrier substrate provided with an adhesive layer; placing at least one of the light-emitting unit and at least one of the driver chip on the adhesive layer in such a manner that the light-emitting unit and the driver chip are spaced apart from each other, wherein each of the light-emitting unit and the driver chip has a front side and an opposing back side, wherein the front sides of the light-emitting unit and the driver chip are disposed on the same side and both face the adhesive layer, and wherein the front side of the light-emitting unit is provided with the light exit region and the front side of the driver chip is provided with the photosensitive member; filling a plastic encapsulation material between the light-emitting unit and the driver chip and curing the plastic encapsulation material to form the plastic encapsulation layer, wherein the plastic encapsulation layer has a front side and an opposing back side, wherein the plastic encapsulation layer, the light-emitting unit and the front side of the driver chip are disposed on the same side, and wherein the front and back sides of the light-emitting unit and the front side of the driver chip are exposed from the plastic encapsulation layer; removing the carrier substrate; forming the plurality of through holes in the plastic encapsulation layer, the plurality of through holes extending through the plastic encapsulation layer in the thickness direction thereof, filling the conductive material in the through holes, and forming the first structure on the front side of the plastic encapsulation layer, the first structure electrically connected on the front side of the plastic encapsulation layer to the conductive material in the through holes, the light-emitting unit and the driver chip; and forming a second structure on the back side of the plastic encapsulation layer, the second structure electrically connected on the back side of the plastic encapsulation layer to both the conductive material in the through holes and the light-emitting unit.

The present invention provides an optical sensor device and a packaging method for the optical sensor device. The optical filter structure includes a light-emitting module, a first structure, a second structure and a mask layer, the first and second structures are formed on opposing ends of light-emitting module and cover portions of light-emitting module, the light-emitting module includes a light exit region, a photosensitive member and an optical filter layer, the light exit region and photosensitive member are both located on a side of light-emitting module close to first structure, the first structure exposes light exit region and photosensitive member, the optical filter layer wraps exposed portion of photosensitive member, the mask layer is arranged on first structure and surface of light-emitting module facing first structure, and the mask layer exposes light exit region and photosensitive member, avoiding influence of external light on optical sensor device through mask layer, so as to improve optical performance of optical sensor device. The use of optical filter layer integrated into driver chip to replace the existing filter structure saves dedicated filter structure, which can save space and thus reduce size of optical sensor device.

In addition, in the present invention, a light-emitting unit and a driver chip are embedded in a plastic encapsulation material (plastic encapsulation layer), and thin-film wires (a first metal layer, a second metal layer and a conductive material in through holes) are formed on the plastic encapsulation material. In this way, the optical sensor device is allowed to have a reduced size, which results in space savings.

DESCRIPTION OF REFERENCE NUMERALS IN DRAWINGS

110: Plastic Encapsulation Layer; 120: Driver Chip; 121: Main Body; 122: Input/Output Port; 123: Photosensitive Member; 124: Optical Filter layer; 130: Light-Emitting Device; 131: First Electrode; 132: Second Electrode; 133: Light Exit Region; 134: Light-Emitting Body; 140: Electrical Conduction Element; 150: Through Hole; 210: First Passivation Layer; 220: First Metal Layer; 230: Second Passivation Layer; 240: Third Passivation Layer; 250: Second Metal Layer; 260: Fourth Passivation Layer; 270: Connecting Hole; 300: Mask Layer; 310: Opening.

DETAILED DESCRIPTION

The optical sensor device and packaging method for the optical sensor device according to the present invention will be described in greater detail below. The present invention will be described in greater detail below with reference to the accompanying drawings, which present preferred embodiments of the invention. It would be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of actual implementations are described in this specification. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

Objects and features of the present invention will become more apparent upon reading the following more detailed description thereof made with reference to the accompanying drawings and particular embodiments. Note that the figures are provided in a very simplified form not necessarily drawn to exact scale and for the only purpose of facilitating easy and clear description of the disclosed embodiments.

It is to be noted that, for the sake of simplicity and clarity, only one light-emitting unit and one driver chip are described herein and shown in schematic cross-sectional structural views.

Figure 1:
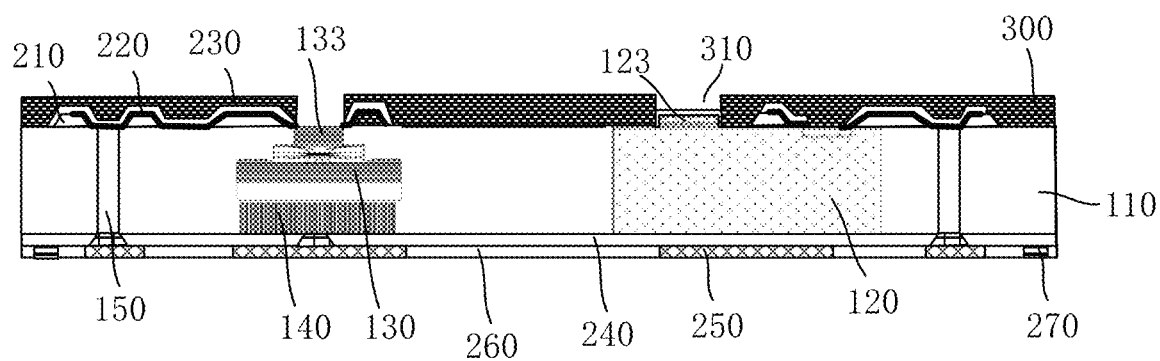
FIG. 1 is a schematic diagram showing the structure of an optical sensor device according to an embodiment of present invention.

As shown in FIG. 1, the optical sensor device according to this embodiment includes a light-emitting module, a first structure, a second structure and a mask layer. The first structure and the second structure are formed on opposing ends of the light-emitting module and cover portions of the light-emitting module.

The light-emitting module includes a light exit region and a photosensitive member. The light exit region and the photosensitive member are both located on the side of the light-emitting module close to the first structure. The first structure exposes the light exit region and the photosensitive member. The optical filter layer wraps the exposed portion of the photosensitive member. The mask layer is arranged on the first structure and the surface of the light-emitting module facing the first structure, and the mask layer exposes the light exit region and the photosensitive member of the light-emitting module.

Figure 4A:
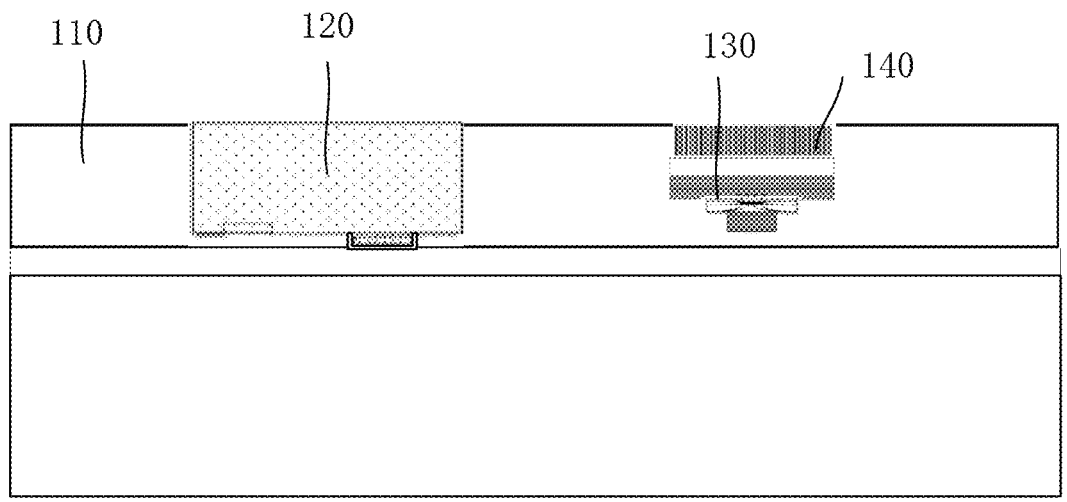
FIGS. 4a to 4c are schematic diagrams of structures formed in a method for packaging an optical sensor device according to an embodiment of present invention.
Figure 4B:
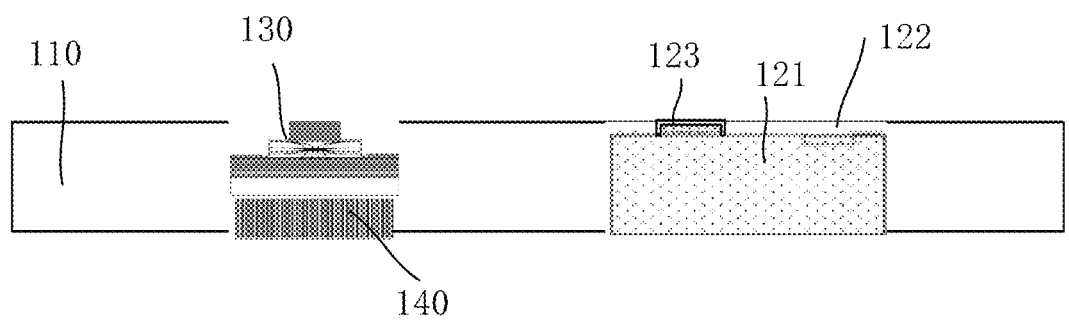
Figure 4C:
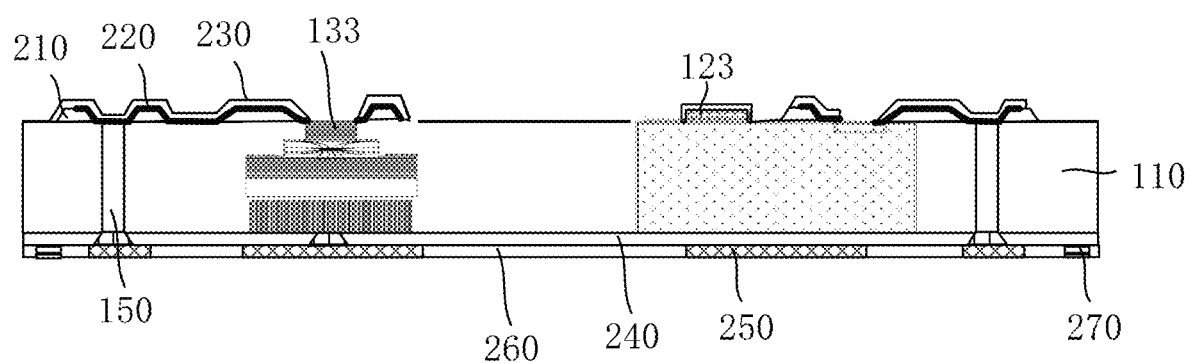

As shown in FIG. 4c, in connection with FIG. 1, the light-emitting module includes a plastic encapsulation layer 110, a light-emitting unit and a driver chip 120. The light-emitting unit and the driver chip 120 are embedded in the plastic encapsulation layer 110. The light-emitting unit and the driver chip 120 are spaced apart from each other.

Wherein, the material of the plastic encapsulation layer 110 is light tight resin material (such as black light tight resin material), which can prevent the influence of light incident from the light-emitting module on the driver chip 120.

In this embodiment, each of the plastic encapsulation layer 110, the light-emitting unit and the driver chip 120 have a front side and a back side. The back sides of the plastic encapsulation layer 110, the light-emitting unit and the driver chip 120 face the same direction, and the front sides of the plastic encapsulation layer 110, the light-emitting unit and the driver chip 120 also face the same direction. The front and back sides of the light-emitting unit and the front side of the driver chip 120 are exposed from the plastic encapsulation layer 110. In order to enable the light-emitting module to have minimized thickness, a thickness of the plastic encapsulation layer 110 is equal to the thinnest thickness of the light-emitting unit and the driver chip 120. Since the thickness of the light-emitting unit may vary as required, the thickness of the plastic encapsulation layer 110 may be configured to be equal to the thickness of the driver chip 120. In this case, the front and back sides of the driver chip 120 and the front and back sides of the light-emitting unit are exposed from the plastic encapsulation layer 110.

Figure 2:
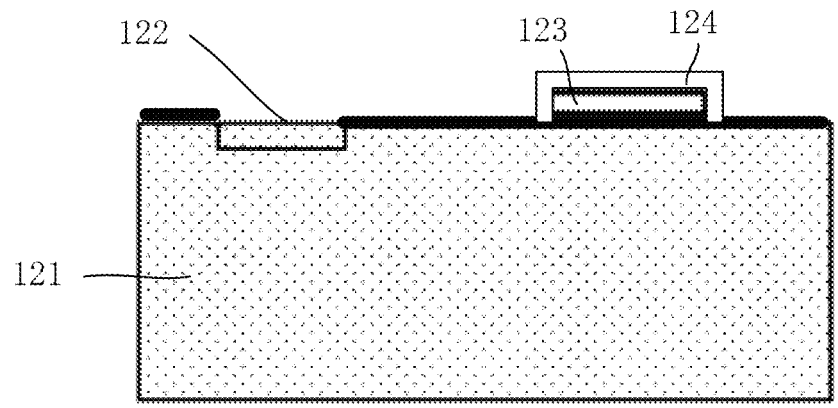
FIG. 2 is a schematic diagram showing the structure of a driver chip according to an embodiment of present invention.

As shown in FIG. 2, in conjunction with FIG. 1, the driver chip 120 includes a main body 121, an input/output port 122, a photosensitive member 123 and an optical filter layer 124. The input/output port 122 and the photosensitive member 123 are disposed on the same side, and are spaced apart from each other on the main body 121. The main body 121 is disposed close to the back side of the plastic encapsulation layer 110. Both the input/output port 122 and the photosensitive member 123 are disposed close to the front side of the plastic encapsulation layer 110.

The input/output port 122 and the optical filter layer 124 are exposed from the front side of the plastic encapsulation layer 110. A surface of the main body 121 away from the photosensitive member 123 may be exposed from the back side of the plastic encapsulation layer 110 or not. The photosensitive member 123 can receive a reflection of light from the light-emitting unit as a signal and provide the signal to the main body 121, which is adapted to issue various commands via the input/output port 122.

The optical filter layer 124 is adapted to filter out light signals at some wavelengths, such as visible light. It allows passage of only light signals from the photosensitive member 123 and reflections of them from objects stricken by them. Wherein, the thickness of the optical filter layer 124 is 5 µm~19 µm. Wavelengths of light signals that are allowed to pass through the optical filter layer 124 ranges from 780 nm to 1500 nm. The material of the optical filter layer 124 is tombarthite or silicon dioxide.

As shown in FIG. 1, the light-emitting unit includes a light-emitting device 130 and an electrical conduction element 140. The electrical conduction element 140 is electrically connected to the light-emitting device 130. The light-emitting device 130 is disposed close to the front side of the plastic encapsulation layer 110. The electrical conduction element 140 is disposed close to the back side of the plastic encapsulation layer 110. At least part of a surface of the electrical conduction element 140 close to the back side of the plastic encapsulation layer 110 is exposed from the back side of the plastic encapsulation layer 110. At least part of a surface of the light-emitting device 130 close to the front side of the plastic encapsulation layer 110 is exposed from the front side of the plastic encapsulation layer 110. Additionally, silver paste applied between the electrical conduction element 140 and the light-emitting device 130 adhesively bonds the electrical conduction element 140 to the light-emitting device 130. In this way, the electrical conduction element 140 is electrically connected to the light-emitting device 130 vertically by the silver paste. Further, the electrical conduction element 140 provides a good heat dissipation effect.

Figure 3:
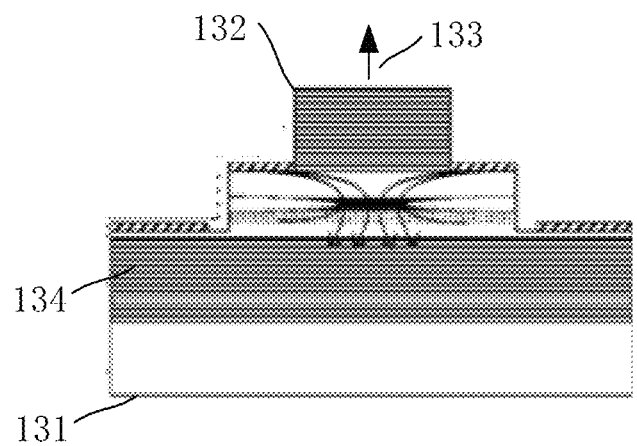
FIG. 3 is a schematic diagram showing the structure of a light-emitting device according to an embodiment of present invention.

Referring to FIG. 3, in connection with FIG. 1, the light-emitting device 130 may be a light-emitting diode (LED), a vertical-cavity surface-emitting laser (VCSEL) or the like. The light-emitting device 130 is adapted to transmit a light signal at a particular wavelength. The light-emitting device 130 includes a light-emitting body 134, a first electrode 131, a second electrode 132 and a light exit region 133. The first electrode 131 is, for example, a cathode of the light-emitting unit and is disposed close to the back side of the plastic encapsulation layer 110. The second electrode 132 and the light exit region 133 are both disposed close to the front side of the plastic encapsulation layer 110. The second electrode 132 is, for example, an anode of the light-emitting unit. During operation of the light-emitting unit, light (e.g., IR light) is emanated from the light exit region 133. The second electrode 132 and the light exit region 133 exposed from the front side of the plastic encapsulation layer 110. At least part of the surface of the electrical conduction element 140 close to the back side of the plastic encapsulation layer 110 is exposed from the back side of the plastic encapsulation layer 110.

With continued reference to FIG. 1, a plurality of through holes 150 are provided in the plastic encapsulation layer 110. The through holes 150 extend through the front side and the back side of the plastic encapsulation layer 110 in the thickness direction. Moreover, a conductive material is filled in the plurality of through holes 150. The conductive material is filled in the through holes 150 in order to connect circuitry on the front side of the plastic encapsulation layer 110 to circuitry on the back side of the plastic encapsulation layer 110.

The conductive material is, for example, a conductive metal such as copper (Cu), tungsten (W), silver (Ag) or gold (Au), a conductive alloy or a conductive paste.

The first structure on the front side of the plastic encapsulation layer 110 is electrically connected to the conductive material in the through holes 150, as well as to both the first electrode 131 in the light-emitting device 130 and the input/output port 122 in the driver chip 120.

The first structure is formed on the front side of the plastic encapsulation layer 110. The first structure includes a first passivation layer 210, a first metal layer 220 and a second passivation layer 230, which are formed over the front side of the plastic encapsulation layer 110 sequentially in this order. The first passivation layer 210 covers the front side of the plastic encapsulation layer 110 and the front side of the driver chip 120 in such a manner that the input/output port 122 in the driver chip 120 and the optical filter layer 124 above the photosensitive member 123, the second electrode 132 and the light exit region 133 in the light-emitting device 130 and part of the front side of the plastic encapsulation layer 110 are exposed from the first passivation layer 210, and that the conductive material in the through holes 150 is exposed from the front side of the plastic encapsulation layer 110.

The first metal layer 220 includes a plurality of first bonding pads disposed on parts of the first passivation layer 210. These first bonding pads are electrically connected to the input/output port 122, the conductive material in the through holes 150 and the second electrode 132.

The second passivation layer 230 covers the first passivation layer 210 and the first metal layer 220. The first passivation layer 210 and the second passivation layer 230 are adapted for electrical isolation of the first metal layer 220 and avoidance of a short circuit. The photosensitive member 123 in the driver chip 120 and the light exit region 133 in the light-emitting device 130 are exposed from the second passivation layer 230.

The first passivation layer 210 and the second passivation layer 230 are insulating materials such as polymer materials. Examples of these include one or a combination of several of polyimide (PI), benzocyclobutene (BCB) and poly(p-phenylenebenzobisoxazole) (PBO).

The first metal layer 220 may be a metal material such as Cu, Ag, W or Au, a conductive alloy, an inorganic material such as a conductive oxide (e.g., ITO), or a conductive organic material such as a conductive polymer. A thickness of the first metal layer 220 above a surface of the first passivation layer 210 is approximately between 3 μm and 10 μm, preferably between 3 μm and 5 μm.

The second structure on the back side of the plastic encapsulation layer 110 is electrically connected to the conductive material in the through holes 150 and the electrical conduction element 140.

The second structure is formed on the back side of the plastic encapsulation layer 110. The second structure includes a third passivation layer 240, a second metal layer 250 and a fourth passivation layer 260, which are formed over the back side of the plastic encapsulation layer 110 sequentially in this order. The third passivation layer 240 covers the back side of the plastic encapsulation layer 110 and the back side of the driver chip 120 in such a manner that part of the back side of the light-emitting unit is exposed from the third passivation layer 240 and that the conductive material in the through holes are exposed from the back side of the plastic encapsulation layer 110. Specifically, the third passivation layer 240 covers the back side of the plastic encapsulation layer 110 and the surface of the main body 121 away from the photosensitive member 123 in such a manner that part of a surface of the electrical conduction element 140 in the light-emitting unit away from the front side of the plastic encapsulation layer 110 is exposed from the third passivation layer 240 and that the conductive material in the through holes 150 is exposed from the back side of the plastic encapsulation layer 110.

The second metal layer 250 includes a plurality of second bonding pads disposed on parts of the third passivation layer 240. These second bonding pads are electrically connected to the conductive material in the through holes 150 and to the electrical conduction element 140. It is to be noted that the conductive material in the through holes 150 electrically connected to the second metal layer 250 may be further electrically connected to the electrical conduction element 140 or not, as practically required.

The fourth passivation layer 260 covers the third passivation layer 240 and the second metal layer 250. The third passivation layer 240 and the fourth passivation layer 260 are adapted for electrical isolation of the second metal layer 250 and avoidance of a short circuit.

At least two connecting holes 270 are formed in the fourth passivation layer 260. The second metal layer 250 is exposed in the at least two connecting holes 270. A conductive material is filled in the connecting holes 270. The conductive material in the connecting holes 270 is adapted to be electrically connected to external circuitry (e.g., a PCB or FPC).

The third passivation layer 240 and the fourth passivation layer 260 are insulating materials such as polymer materials. Examples of these include one or a combination of several of polyimide (PI), benzocyclobutene (BCB) and poly(p-phenylenebenzobisoxazole) (PBO). The materials of the first passivation layer 210, the second passivation layer 230, the third passivation layer 240 and the fourth passivation layer 260 may be either identical or different. In this embodiment, the first passivation layer 210, the second passivation layer 230, the third passivation layer 240 and the fourth passivation layer 260 are formed of the same material such as PI.

The second metal layer 250 may be a metal material such as Cu, Ag, W or Au, a conductive alloy, an inorganic material such as a conductive oxide (e.g., ITO), or a conductive organic material such as a conductive polymer. A thickness of the second metal layer 250 above a surface of the third passivation layer 240 is approximately between 3 μm and 10 μm, preferably between 3 μm and 5 μm.

With continued reference to FIG. 1, the optical filter structure also includes a mask layer 300, which covers the first structure and the light-emitting module from the front side of the plastic encapsulation layer 110. The mask layer 300 is formed with openings 310 both above the light exit region 133 and the photosensitive member 123, the openings 310 expose the light exit region 133 and the photosensitive member 123, so that the light can be vertically emitted from the light exit region 133 and can be vertically incident to the photosensitive member 123, avoiding the influence of light entering from other directions on the photosensitive member 123, thus improving the optical performance of the optical sensor device.

Wherein, the thickness of the mask layer 300 is not more than 75 μm, and the depth-width ratio of the opening 310 is greater than or equal to 10:1. The material of the mask layer 300 is light tight organic polymer material, so that it can block visible light, and the penetration rate of infrared light is less than 1%.

Optionally, the opening 310 is filled with a transparent polymer material to isolate the external environment from the light exit region 133 and the photosensitive member 123.

According to this embodiment, the light-emitting unit and the driver chip in the light-emitting module are buried in the plastic encapsulation material (the plastic encapsulation layer), and thin film wires (the first metal layer, the second metal layer and the conductive material in the through holes) are fabricated on the plastic encapsulation material. This enables the optical sensor device to have a reduced size, resulting in space savings. The light mask material is integrated on the driver chip, which saves the special filter structure, further saves space, and makes the overall thickness of the optical sensor device less than 400 μm.

In embodiments of the present invention, there is also provided a packaging method for an optical sensor device, which includes the steps as follows.

S1: Provide a carrier substrate. The carrier substrate is provided on its one side with an adhesive layer. The carrier substrate is, for example, square or circular in shape. The carrier substrate is temporary carrier substrate.

S2: Place at least one light-emitting unit and at least one driver chip 120 on the second adhesive layer, with front sides of the light-emitting unit and of the driver chip 120 both facing the adhesive layer. Both the light-emitting unit and the driver chip 120 have the front side and an opposing back side. The front sides of the light-emitting unit and the driver chip 120 are oriented to both face the adhesive layer. The light-emitting unit has a light exit region 133 on its front side, and the driver chip 120 has a photosensitive member 123 on its front side.

S3: Fill a plastic encapsulation material between the light-emitting unit and the driver chip 120 and cure the plastic encapsulation material to form a plastic encapsulation layer. The plastic encapsulation layer 110 has a front side and an opposing back side. The front sides of the plastic encapsulation layer, the light-emitting unit and the driver chip 120 face the same direction, and the front and back sides of the light-emitting unit and the front side of the driver chip are exposed from the plastic encapsulation layer (as shown in FIG. 4a).

S4: Remove the carrier substrate (as shown in FIG. 4b).

S5: Form, in the plastic encapsulation layer 110, a plurality of through holes 150 extending through the plastic encapsulation layer 110 in a thickness direction thereof, fill a conductive material in the through holes 150, form a first structure on the front side of the plastic encapsulation layer 110, wherein the first structure is electrically connected on the front side of the plastic encapsulation layer 110 to the conductive material in the through holes 150 and to both the light-emitting unit and the driver chip 120, and form a second structure on the back side of the plastic encapsulation layer 110, wherein the second structure is electrically connected on the back side of the plastic encapsulation layer 110 to the conductive material in the through holes 150 and to the light-emitting unit (as shown in FIG. 4c).

Openings are formed in the first passivation layer 210 of the first structure, in which an input/output port 122 and a photosensitive member 123 in the driver chip 120 and a second electrode 132 and a light exit region 133 in the light-emitting device 130 are exposed. Openings are formed in the third passivation layer 240 of the second structure, in which part of a surface of an electrical conduction element 140 away from the front side of the plastic encapsulation layer 110 is exposed, and the conductive material in the through holes is exposed from a back side thereof. At least two connecting holes 270 are formed in a fourth passivation layer 260 in the second structure. A second metal layer is exposed in the at least two connecting holes 270. Moreover, a nickel gold layer is plated, or a tin solder material is applied, at the at least two connecting holes 270, and welding to an external circuit is accomplished with the tin solder material.

S6: Forming a mask layer 300 is formed. The mask layer 300 covers the first structure and the light-emitting module from the front side of the plastic encapsulation layer 110, and exposes the light exit region 133 and the light sensing member 123 (as shown in FIG. 1).

In this step, the mask layer 300 is applied to a designated location by screen printing, or by exposure using a photomask and subsequent development if it is a photosensitive material, or by another technique. The mask layer 300 forms openings both in the light exit region 133 and the light sensing member 123. The mask layer 300 may be at least applied to the second passivation layer 230 and to the plastic encapsulation layer 110.

Optionally, the openings 310 are then filled with a transparent polymer material to isolate the external environment from the light exit region 133 and the light sensing member 123.

In summary, the present invention provides an optical sensor device and a packaging method for the optical sensor device, in which a light-emitting unit and a driver chip are embedded in a plastic encapsulation material (plastic encapsulation layer), and thin-film wires (a first metal layer, a second metal layer and a conductive material in through holes) are formed on the plastic encapsulation material. In this way, the optical sensor device is allowed to have a reduced size, which results in space savings. The optical filter layer integrated into the driver chip replaces the optical filter structure in the existing technology, saves the special optical filter structure, can further save the space, thus further reduces the size of the optical sensor device. In addition, the influence of external light on the optical sensor device is avoided through the mask layer, so as to improve the optical performance of the optical sensor device.

It is to be noted that, as used herein, the terms "first", "second" and the like are only meant to distinguish various components, elements, steps, etc. from each other rather than indicate logical or sequential orderings thereof, unless otherwise indicated or specified.

It is to be understood that while the invention has been described above with reference to preferred embodiments thereof, it is not limited to these embodiments. In light of the above teachings, any person familiar with the art may make many possible modifications and variations to the disclosed embodiments or adapt them into equivalent embodiments, without departing from the scope of the invention. Accordingly, it is intended that any and all simple variations, equivalent changes and modifications made to the foregoing embodiments based on the substantive disclosure of the invention without departing from the scope thereof fall within this scope.

What is claimed is:

1. A packaging method for an optical sensor device, comprising the steps of: forming a light-emitting module, forming a first structure and a second structure respectively on opposing ends of the light-emitting module, the first structure and the second structure covering portions of the light-emitting module, the light-emitting module comprising a light exit region, a photosensitive member and an optical filter layer, wherein the light exit region and the photosensitive member are both located on a side of the light-emitting module close to the first structure, the first structure exposes the light exit region and the photosensitive member, the optical filter layer wraps the exposed portion of the photosensitive member; and forming a mask layer, the mask layer arranged on the first structure and the surface of the light-emitting module facing the first structure and exposing the light exit region and the optical filter on the photosensitive member of the light-emitting module, forming a light-emitting module specifically comprising: providing a carrier substrate, one side of the carrier substrate provided with an adhesive layer; placing at least one light-emitting unit and at least one driver chip on the adhesive layer in such a manner that the light-emitting unit and the driver chip are spaced apart from each other, wherein each of the light-emitting unit and the driver chip has a front side and an opposing back side, wherein the front side of the light-emitting unit and the front side of the driver chip are disposed on the same side and both face the adhesive layer, and wherein the front side of the light-emitting unit is provided with the light exit region and the front side of the driver chip is provided with the photosensitive member; filling a plastic encapsulation material between the light-emitting unit and the driver chip and curing the plastic encapsulation material to form a plastic encapsulation layer, wherein the plastic encapsulation layer has a front side and an opposing back side, wherein the plastic encapsulation layer, the light-emitting unit and the front side of the driver chip are disposed on the same side, and wherein the front side and the back side of the light-emitting unit and the front side of the driver chip are exposed from the plastic encapsulation layer; removing the carrier substrate; forming a plurality of through holes in the plastic encapsulation layer, the plurality of through holes extending through the plastic encapsulation layer in a thickness direction thereof, filling a conductive material in the through holes; forming the first structure on the front side of the plastic encapsulation layer, the first structure electrically connected on the front side of the plastic encapsulation layer to the conductive material in the through holes, the light-emitting unit and the driver chip; and forming the second structure on the back side of the plastic encapsulation layer, the second structure electrically connected on the back side of the plastic encapsulation layer to both the conductive material in the through holes and the light-emitting unit.

2. The packaging method of claim 1, wherein openings are formed in the light exit region and the photosensitive member.

3. The packaging method of claim 2, wherein a depth-width ratio of each opening is greater than or equal to 10:1.

4. The packaging method of claim 1, wherein the mask layer has a thickness of not more than 75 μm.

* * * * *